(12) United States Patent
Lesea

(10) Patent No.: US 8,397,191 B1
(45) Date of Patent: Mar. 12, 2013

(54) DETERMINING FAILURE RATE FROM CIRCUIT DESIGN LAYOUTS

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/290,903

(22) Filed: Nov. 7, 2011

(51) Int. Cl.
*G06F 17/50* (2006.01)
*G06F 11/00* (2006.01)
*G01V 3/00* (2006.01)
*G01V 7/00* (2006.01)
*G01R 31/28* (2006.01)

(52) U.S. Cl. ............. 716/106; 716/112; 703/2; 703/16; 702/59; 702/118; 714/25; 714/724; 324/537

(58) Field of Classification Search ............... 716/106, 716/112; 703/2, 16; 702/59, 118; 714/25, 714/724; 324/537
See application file for complete search history.

(56) References Cited

U.S. PATENT DOCUMENTS

| 5,313,266 | A  | * | 5/1994  | Keolian et al. | 356/477 |
| 5,396,169 | A  | * | 3/1995  | Buehler et al. | 324/762.01 |
| 6,526,559 | B2 | * | 2/2003  | Schiefele et al. | 326/11 |
| 6,963,824 | B1 | * | 11/2005 | Davidson et al. | 703/2 |
| 7,200,825 | B2 | * | 4/2007  | Watson et al. | 716/115 |
| 7,219,318 | B2 | * | 5/2007  | Wu et al. | 716/112 |
| 7,219,325 | B1 | * | 5/2007  | Lysaght | 716/117 |
| 7,406,673 | B1 | * | 7/2008  | Patterson et al. | 716/117 |
| 7,535,213 | B1 |   | 5/2009  | Lesea |  |
| 7,650,585 | B1 | * | 1/2010  | Miller et al. | 716/138 |
| 7,694,250 | B2 | * | 4/2010  | Boutin | 716/106 |
| 7,930,662 | B1 | * | 4/2011  | Sundararajan et al. | 716/104 |
| 8,225,252 | B2 | * | 7/2012  | Alcocer Ochoa et al. | 716/106 |

OTHER PUBLICATIONS

Ahlbin, Jonathan R. et al., "Effect of Multiple-Transistor Charge Collection on Single-Event Transient Pulse Widths," *IEEE Transactions on Device and Materials Reliability*, Sep. 2011, pp. 401-406, vol. 11, No. 3, IEEE, Piscataway, New Jersey, USA.

Baumann, Robert C., "Radiation-Induced Soft Errors in Advanced Semiconductor Technologies " *IEEE Transactions on Device and Materials Reliability*, Sep. 2005, pp. 305-316, vol. 5, No. 3, IEEE, Piscataway, New Jersey, USA.

Cannon, Ethan H. et al., "Protecting Big Blue from Rogue Subatomic Particles," *Proc. of the 2007 IEEE International Conference on Integrated Circuit Design*, May 30, 2007, pp. 1-6, IEEE, Piscataway, New Jersey, USA.

Ibe, Eishi et al., "Impact of Scaling on Neutron-Induced Soft Error in SRAMs From a 250 nm to a 22 nm Design Rule," *IEEE Transactions on Electron Devices*, Jul. 2010, pp. 1527-1538, vol. 57, No. 7, IEEE, Piscataway, New Jersey, USA.

(Continued)

*Primary Examiner* — Phallaka Kik
(74) *Attorney, Agent, or Firm* — LeRoy D. Maunu; Lois D. Cartier

(57) ABSTRACT

In one embodiment, a method is provided for determining a level of resilience of a circuit to single event upsets based on a layout of a circuit design. A set of locations in the layout of the circuit design is selected. A respective maximum level of linear energy transfer (LET) that is tolerable for each location in the selected set is determined. For each determined maximum level of LET, cross-section values at locations having the maximum level of LET are summed to determine a respective total cross-section value for the maximum level of LET. For each determined maximum level of LET, the total cross-section value is divided by the determined maximum level of LET to produce respective intermediate values. The respective intermediate values are summed to determine a level of resilience.

20 Claims, 2 Drawing Sheets

OTHER PUBLICATIONS

Karnik, Tanay et al., "Characterization of Soft Errors Caused by Single Event Upsets in CMOS Processes," *IEEE Transactions on Dependable and Secure Computing*, Apr.-Jun. 2004, pp. 128-143, vol. 1, No. 2, IEEE, Piscataway, New Jersey, USA.

Vial, C. et al., "A New Approach for the Prediction of the Neutron-Induced SEU Rate " *IEEE Transactions on Nuclear Science* Dec. 1998, pp. 2915-2920, vol. 45, No. 6, IEEE, Piscataway, New Jersey, USA.

\* cited by examiner

DETERMINING FAILURE RATE FROM CIRCUIT DESIGN LAYOUTS

FIELD OF THE INVENTION

One or more embodiments generally relate to determining a failure rate of circuits due to radiation-induced soft errors.

BACKGROUND

Cosmic radiation includes high-energy atomic particles. When cosmic radiation strikes an integrated circuit, the high-energy atomic particles can create a string of hole and electron pairs in a substrate of the integrated circuit. This charge trail results in secondary electrons, which are then unbound and travel to circuit nodes where they are collected. A circuit node of the integrated circuit can collect the holes or the electrons. If a storage node collects enough charge from the electrons, the value stored by the storage node can become corrupted. This corruption of a storage node is denoted a soft error because the integrated circuit again operates properly after a reset and/or correction of the corrupted value.

For applications in a space environment, the impacts of high-energy particles may be simulated using a simplified model of deposition of a fixed charge per unit length of a path of the particles through a semiconductor device. This simplified model is sufficient for the space environment because ions almost always have sufficient energy to pass entirely through the semiconductor device. The energies of these ions range beyond 1 GeV (gigaelectron volt) and the mass of some of the heavy ions ranges from the mass of a hydrogen atom (a proton) to the mass of a gold atom. However, within Earth's atmosphere, particle radiation energies generated as secondaries from an atmospheric high-energy neutron strike are significantly less than those encountered in space. The range of the ion track in the device is typically less than tens of microns and impacting ions deposit most of their energy just before they are stopped. Therefore, the simplified model used previously to determine the upset error rate in a space environment is not sufficient to provide an accurate estimation of the error rate from particle radiation in an atmospheric environment.

One or more embodiments may address one or more of the above issues.

SUMMARY

In one embodiment, a method is provided for determining a level of resilience of a circuit to single event upsets based on a layout of a circuit design. A set of locations in the layout of the circuit design is selected. A respective maximum level of linear energy transfer (LET) that is tolerable for each location in the selected set is determined. For each determined maximum level of LET, cross-section values at locations having the maximum level of LET are summed to determine a respective total cross-section value for the maximum level of LET. For each determined maximum level of LET, the total cross-section value is divided by the determined maximum level of LET to produce respective intermediate values. The respective intermediate values are summed to determine a level of resilience.

In another embodiment, a method is provided for determining a failure rate of a circuit to single event upsets based on a layout of a circuit design. A set of locations in the layout of the circuit design is selected. A respective maximum level of linear energy transfer (LET) tolerable for each location in the selected set is determined. For each location in the data set, an intermediate value is retrieved from a look-up table corresponding to the determined maximum LET. The respective intermediate values are summed to determine the failure rate.

In yet another embodiment, an article of manufacture is provided. The article is characterized by a non-transitory processor-readable medium with an executable program stored thereon. The program instructs a processor to select a set of locations in the layout of a circuit design and to determine a respective maximum level of linear energy transfer (LET) that is tolerable for each location in the selected set. For each determined maximum level of LET, the program instructs the processor to sum cross-section values at locations having the maximum level of LET to determine a respective total cross-section value for the maximum level of LET. For each determined maximum level of LET, the program causes the processor to divide the total cross-section value by the determined maximum level of LET to produce respective intermediate values. The respective intermediate values are summed to determine a level of resilience of the layout of the circuit design.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings, in which.

DETAILED DESCRIPTION

One or more embodiments provide an efficient method of simulation for determining susceptibility of a semiconductor circuit layout to upset. The method simulates one or more particle impacts at a number of locations in the circuit layout. From the simulation, the method determines the minimum particle energy levels that are likely to cause upsets at the selected locations in a semiconductor circuit implemented according to the design. Based on the determined energy levels, a susceptibility value is determined based on particle energies that may be encountered in a terrestrial environment.

Figure 1:
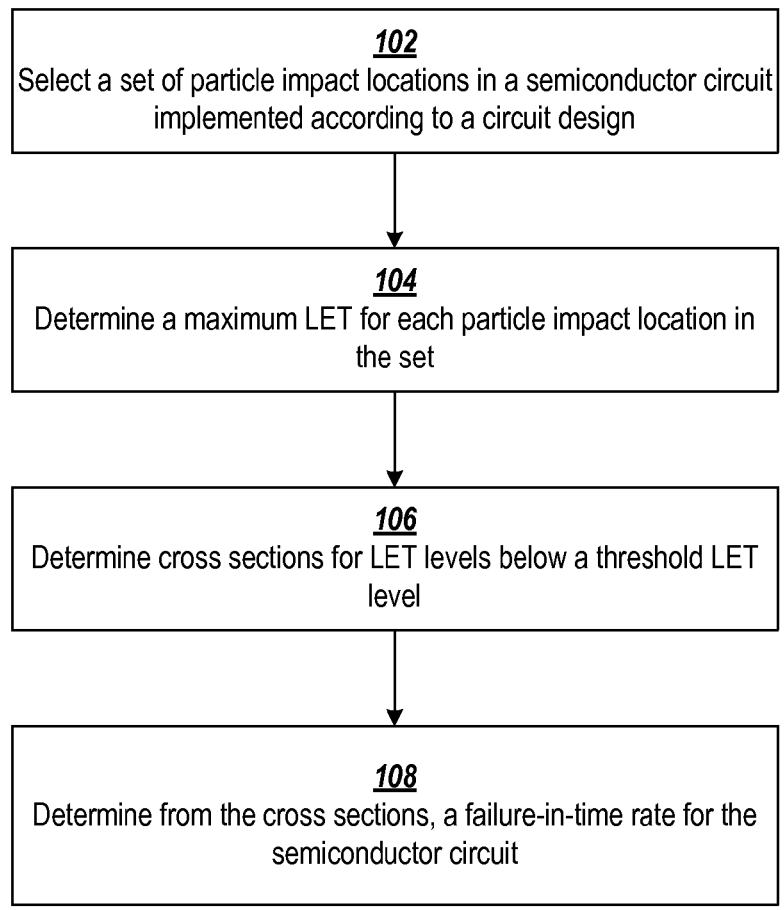
FIG. 1 shows a flowchart of a process for determining resilience of a semiconductor design to single event upsets, in accordance with one or more embodiments.

FIG. 1 shows a flowchart of a process for determining susceptibility of a semiconductor design layout to single event upsets, in accordance with one or more embodiments. A set of particle impact locations of a semiconductor design is selected at block 102. A respective level of maximum linear energy transfer (LET) is determined for each particle impact location in the set at block 104. For n locations, LET levels $LET_1$-$LET_N$ are determined. LET is a measure of the energy transferred to the device per unit length as an ionizing particle travels through a material. One common LET unit of measurement is MeV-cm$^2$/mg of material. The material is silicon (Si) for MOS devices, for example. The maximum level of LET for an impact location refers to the lowest level of LET that is sufficient to cause upset at the impact location. The JEDEC Solid State Technology Association recommended definition is the lowest level of LET at which particle fluence=$10^7$ ions/cm$^2$.

In one or more embodiments, the particle impacts are simulated using a technology computer aided design (TOAD) simulation and a SPICE simulation. The TOAD simulation models charge distribution and collection resulting from the one or more particle impacts, and the SPICE simulation models circuit behavior of the circuit. In one or more embodiments, the TOAD simulation may check various LET levels up to an LET threshold level of approximately 14.2, which is the maximum level of LET encountered by secondary ions occurring in a terrestrial environment. However, an LET threshold level ranging from 14.0 to 15.0 should be sufficient. The simulation may be repeated with the selected LET level being increased in each iteration, and the simulation stopped in response to detecting a failure. In another example, a LET level may be selected in each iteration using a binary search algorithm. In the later example, simulation is iteratively repeated until the remaining search space is less than a threshold tolerance. By limiting the search space to the possible LET energies of secondary ions, simulation runtime may be reduced.

A respective cross-section is determined for each LET level below a threshold LET level at block 106. For a threshold LET level, $LET_T$, cross-sections $CS_1$-$CS_m$ are determined, where m<=n. Cross-section is a probability coefficient, based on a unit of area, which links the number of particle interactions of interest with corresponding incident flux of fluence levels of the striking particles. For test or simulation at a specific LET, cross-section ($\sigma$) is given by:

$$\sigma = \frac{N}{\varphi} \text{ (cm}^2\text{/device bit)},$$

where N is the number of detected upsets and $\varphi$ is the particle fluence during the exposure.

At block 108, a failure-in-time (FIT) rate is determined using the cross-sections from block 106. Each cross-section $CS_i$ (1<=i<=m) is divided by the corresponding LET, $LET_j$, (1<=l<=m) to produce an intermediate value, $V_i$. The intermediate values are summed to produce a susceptibility indicator ($S = \Sigma_{j=1}^{j=m}(V_j)$) for the semiconductor design. The summing of the intermediate values, which are limited to cross-sections of LET levels below a threshold, provides a strong indicator of susceptibility of the circuit design to particles having energies greater than or equal to the threshold.

For example, alpha particles resulting from, e.g., package decay, exhibit LET energies less than 1.57. To determine a susceptibility of the circuit design layout to alpha particles, the respective intermediate values corresponding to maximum levels of LET that are less than or equal to 1.57 are summed. As another example, secondary ions exhibit LET energies less than approximately 14.2 LET in the terrestrial environment. In order to determine a susceptibility of the circuit design layout in atmospheric conditions, respective intermediate values corresponding to maximum levels of LET that are less than or equal to 14.2 are summed.

The division of cross-sections by respective LET values has the effect of biasing the number of errors in the cross-sections for high LET values, which are correspondingly rare in occurrence in atmospheric spectra population. The result provides a good indication of susceptibility as the energy goes up and the number of particles decreases. Initial verification experiments, using artificial ion impacts, confirm that the produced susceptibility indicator (S) accurately predicts failure rate (FR) of a layout when scaled by a constant (C), as given by:

$$FR=S*C,$$

It is recognized that the constant C may vary (for example, from 500K to 2M), depending on the material and thickness of the semiconductor upon which the circuit design layout is to be implemented. C may be determined experimentally for a given semiconductor, and thereafter used in the above equation to calculate a failure rate for various circuit design layouts. For example, experiments performed on 28 nanometer, high performance, low power circuit technology indicate that S should be scaled by a factor of C=1,000,000, which is approximately equal to the expected probability that the particles would strike atoms in the silicon to produce secondary ions.

Various implementations may select particle impact locations at block 102 differently. In one or more embodiments, the selected locations are evenly spaced points along a line across the circuit design layout. However, in other embodiments more locations may be selected to test sensitive areas of the semiconductor. For example, one or more embodiments may limit selected locations to active areas of the semiconductor, which contain PMOS and/or NMOS devices that may be affected by charged particle strikes.

Simulation of the one or more particle impacts discussed above may simulate a number of particle impacts at a variety of impact angles. However, in non-redundant circuits, the angle of impact is less significant because a particle only needs to strike one cell to cause an error. In one or more embodiments, simulation time is improved by simulating each particle impact at an impact angle that is perpendicular to the layout of the semiconductor design. As the charge travels at a 90-degree angle of incidence, the simplified model captures most of the secondary ions and all of the alphas particles from package and process contamination. Initial experiments using a 6-transistor memory cell layout indicate that the cross-section for 90-degree impacts was less than 10% different (smaller) than cross-sections produced by simulations which also included charge trails at other angles of incidence as well. This first order simplification provides a strong indication of susceptibility at a fraction of the computation time.

Those skilled in the art will appreciate that various alternative computing arrangements, including one or more processors and a memory arrangement configured with program code, would be suitable for hosting the simulation processes of the different embodiments.

Figure 2:
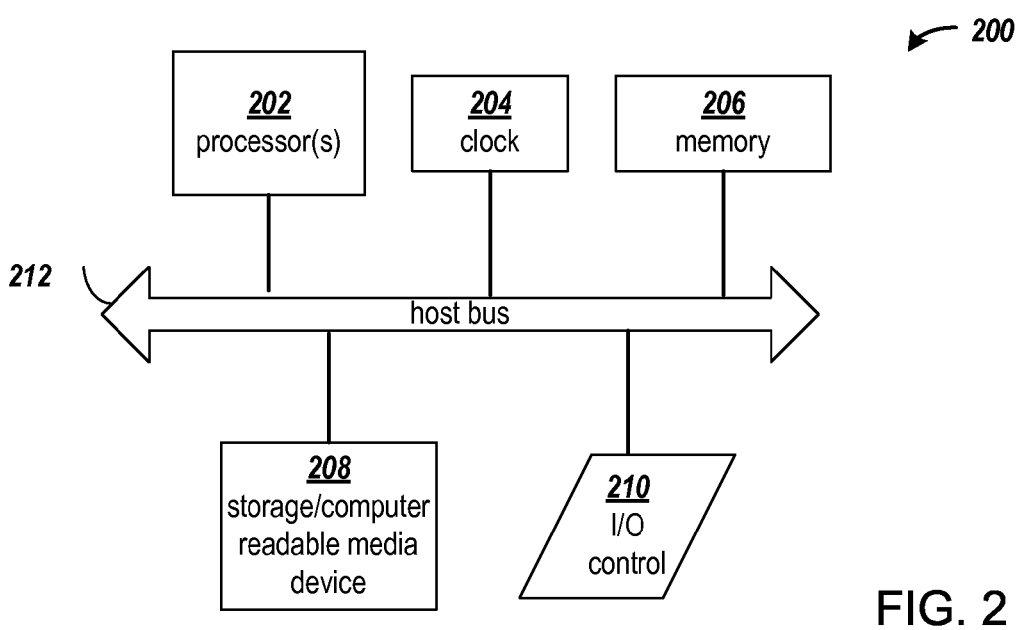
FIG. 2 shows a computing architecture that may be configured to carry out the processes described herein.

FIG. 2 is a block diagram of an example computing arrangement on which the processes described herein may be implemented. Those skilled in the art will appreciate that various alternative computing arrangements, including one or more processors and a memory arrangement configured with program code, would be suitable for hosting the processes and data structures and implementing the algorithms of the different embodiments. The computer code, comprising the processes encoded in a processor executable format, may be stored and provided via a variety of computer-readable storage media or delivery channels such as magnetic or optical disks or tapes, electronic storage devices, or as application services over a network.

Processor computing arrangement 200 includes one or more processors 202, a clock signal generator 204, a memory unit 206, a storage unit 208, and an input/output control unit 210 coupled to host bus 212. The arrangement 200 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements that would be recognized by those skilled in the art. The processor 202 may be one or more general purpose processors, or a combination of one or more general purpose processors and suitable co-processors, or one or more specialized processors (e.g., RISC, CISC, pipelined, etc.).

The memory arrangement 206 typically includes multiple levels of cache memory, and a main memory. The storage arrangement 208 may include local and/or remote persistent storage such as provided by magnetic disks (not shown), flash, EPROM, or other non-volatile data storage. The storage unit may be read or read/write capable. Further, the memory 206 and storage 208 may be combined in a single arrangement.

The processor arrangement 202 executes the software in storage 208 and/or memory 206 arrangements, reads data from and stores data to the storage 208 and/or memory 206 arrangements, and communicates with external devices through the input/output control arrangement 210. These functions are synchronized by the clock signal generator 204. The resource of the computing arrangement may be managed by either an operating system (not shown), or a hardware control unit (not shown).

Figure 3:
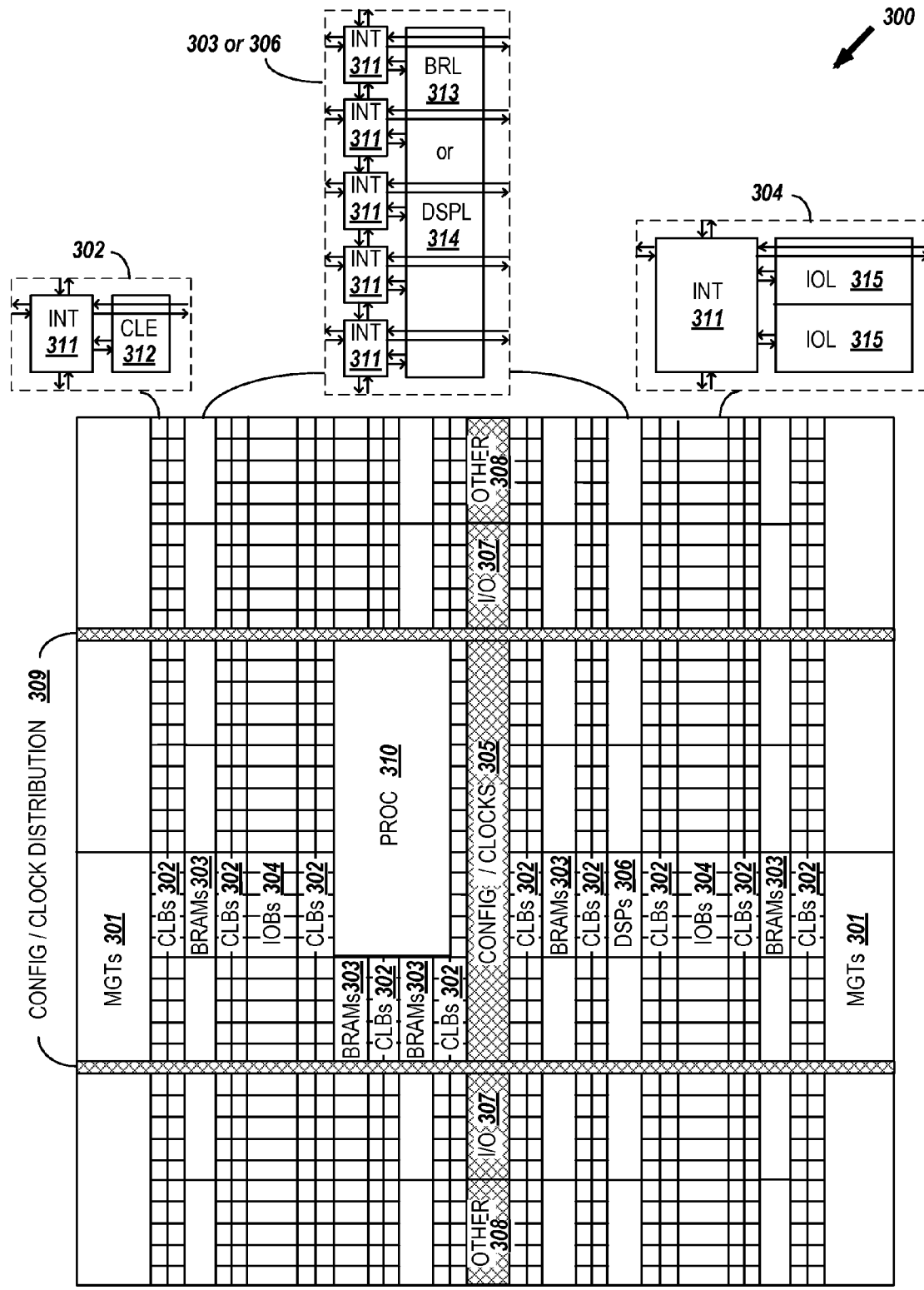
FIG. 3 shows a programmable IC having programmable memory cells that may be simulated, in accordance with one or more embodiments.

FIG. 3 is a block diagram of an example programmable IC having programmable memory cells that may be analyzed for susceptibility to upsets, in accordance with one or more embodiments. Programmable ICs can include several different types of programmable logic blocks in the array. For example, FIG. 3 illustrates a type of programmable IC known as a field programmable gate array (FPGA) (300) that includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307), e.g., clock ports, and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element INT 311 also includes the connections to and from the programmable logic element within the same tile, as shown by the examples included at the top of FIG. 3.

For example, a CLB 302 can include a configurable logic element CLE 312 that can be programmed to implement user logic plus a single programmable interconnect element NT 311. A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 306 can include a DSP logic element (DSPL 314) in addition to an appropriate number of programmable interconnect elements. An 10B 304 can include, for example, two instances of an input/output logic element (IOL 315) in addition to one instance of the programmable interconnect element INT 311. As will be clear to those of skill in the art, the actual I/O pads connected, for example, to the I/O logic element 315 are manufactured using metal layered above the various illustrated logic blocks, and typically are not confined to the area of the input/output logic element 315.

In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic.

The embodiments are thought to be applicable to a variety of semiconductor devices subject to atmospheric radiation effects. Other aspects and embodiments will be apparent to those skilled in the art from consideration of the specification. It is intended that the specification and illustrated embodiments be considered as examples only, with a true scope of the embodiments being indicated by the following claims.

What is claimed is:

1. A method of determining a level of resilience of a circuit to single event upsets based on a layout of a circuit design, comprising:

selecting a set of locations in the layout of the circuit design;

determining by a processor a respective maximum level of linear energy transfer (LET) that is tolerable for each location in the selected set;

for each determined maximum level of LET, summing cross-section values at locations having the maximum level of LET to determine a respective total cross-section value for the maximum level of LET;

for each determined maximum level of LET, dividing the total cross-section value by the determined maximum level of LET, resulting in respective intermediate values; and summing by the processor the respective intermediate values, resulting in the level of resilience.

2. The method of claim 1, wherein determining the respective maximum level of LET tests tolerance of each location for LET up to an LET threshold having a value less than 15 LET.

3. The method of claim 1, wherein summing the respective intermediate values includes summing only the respective intermediate values that correspond to maximum levels of LET less than or equal to 1.57 to determine an alpha particle level of resilience.

4. The method of claim 1, wherein summing the respective intermediate values includes summing only the respective intermediate values that correspond to maximum levels of LET less than or equal to 14.2 to determine an atmospheric level of resilience.

5. The method of claim 1, wherein the locations in the set of locations are evenly spaced points along a line across the layout of the circuit design.

6. The method of claim 1, wherein each of the locations in the set of locations is in an active area of the circuit containing PMOS or NMOS devices or both PMOS and NMOS devices.

7. The method of claim 1, wherein each of the locations in the set of locations is in an area of the circuit that has been identified as being sensitive.

8. The method of claim 1, wherein the determining a respective maximum level of LET that is tolerable in each location includes simulating one or more particle impacts at each location, with an angle of simulated impact being perpendicular to the layout of the circuit design.

9. The method of claim 1, wherein the determining the maximum level of LET tolerable for each location in the selected set includes simulating one or more particle impacts at the location using a plurality of LET values from a search range of LET values.

10. The method of claim 9, wherein simulating the one or more particle impacts at the location using a plurality of LET values from the search range of LET values includes selecting the plurality of LET values from the search range of LET values in using a binary search.

11. The method of claim 10, wherein the search range of LET values includes a maximum LET value equal to 14.2 LET.

12. The method of claim 9, wherein the simulation is a hybrid simulation including Technology Computer Aided Design (TCAD) simulation to model a charge distribution and collection resulting from the one or more particle impacts and a SPICE simulation to model circuit behavior of the circuit.

13. A method of determining a failure rate of a circuit to single event upsets based on a layout of a circuit design, comprising:
    selecting a set of locations in the layout of the circuit design;
    determining by a processor a respective maximum level of linear energy transfer (LET) that is tolerable for each location in the selected set;
    for each location in the data set, retrieving an intermediate value from a look-up table corresponding to the determined maximum LET; and
    summing by the processor the respective intermediate values, resulting in the failure rate.

14. The method of claim 13, wherein determining a respective maximum level of LET that is tolerable in each location includes simulating one or more particle impacts at each location using an angle of simulated impact that is perpendicular to the layout of the circuit design.

15. The method of claim 13, wherein determining the maximum level of LET tolerable for each location in the selected set includes simulating one or more particle impacts at the location using a plurality of LET values from a search range of LET values.

16. The method of claim 15, wherein simulating the one or more particle impacts at the location using a plurality of LET values from the search range of LET values includes selecting the plurality of LET values from the search range of LET values by using a binary search.

17. The method of claim 16, wherein the search range of LET values includes a maximum LET value equal to 15 LET.

18. The method of claim 15, wherein the simulation is a hybrid simulation including Technology Computer Aided Design (TCAD) simulation to model a charge distribution and collection resulting from the one or more particle impacts and a SPICE simulation to model circuit behavior of the circuit.

19. An article of manufacture, comprising:
    a non-transitory processor-readable medium with an executable program stored thereon, wherein the program instructs a processor to perform the following:
    selecting a set of locations in a layout of a circuit design;
    determining a respective maximum level of linear energy transfer (LET) that is tolerable for each location in the selected set;
    for each determined maximum level of LET, summing cross-section values at locations having the maximum level of LET to determine a respective total cross-section value for the maximum level of LET;
    for each determined maximum level of LET, dividing the total cross-section value by the determined maximum level of LET, resulting in respective intermediate values; and
    summing the respective intermediate values, resulting in a level of resilience of the layout of the circuit design.

20. The article of claim 19, wherein the determining the maximum level of LET tolerable for each location in the selected set includes simulating one or more particle impacts at the location using a plurality of LET values from a search range of LET values.

* * * * *